US009823324B2

(12) United States Patent
Pfeuffer et al.

(10) Patent No.: US 9,823,324 B2
(45) Date of Patent: Nov. 21, 2017

(54) METHOD AND APPARATUS FOR DETERMINATION OF A MAGNETIC RESONANCE SYSTEM CONTROL SEQUENCE

(71) Applicant: Siemens Aktiengesellschaft, Munich (DE)

(72) Inventors: Josef Pfeuffer, Kunreuth (DE); Rainer Schneider, Hoechstadt (DE)

(73) Assignee: Siemens Aktiengesellschaft, Munich (DE)

( * ) Notice: Subject to any disclaimer, the term of this patent is extended or adjusted under 35 U.S.C. 154(b) by 538 days.

(21) Appl. No.: 14/519,454

(22) Filed: Oct. 21, 2014

(65) Prior Publication Data
US 2015/0108984 A1 Apr. 23, 2015

(30) Foreign Application Priority Data
Oct. 21, 2013 (DE) .................. 10 2013 221 347

(51) Int. Cl.
| | | |
|---|---|---|
| G01R 33/54 | (2006.01) | |
| G01R 33/30 | (2006.01) | |
| G01R 33/34 | (2006.01) | |
| G01R 33/385 | (2006.01) | |
| G01R 33/48 | (2006.01) | |

(Continued)

(52) U.S. Cl.
CPC ......... G01R 33/546 (2013.01); G01R 33/307 (2013.01); G01R 33/34076 (2013.01);
(Continued)

(58) Field of Classification Search
CPC .............. G01R 33/546; G01R 33/307; G01R 33/34076; G01R 33/3852; G01R 33/4818; G01R 33/4833; G01R 33/56572
See application file for complete search history.

(56) References Cited

U.S. PATENT DOCUMENTS 8,542,013 B2* 9/2013 Mo.beta.nang .... G01R 33/5612
324/307
2011/0254545 A1* 10/2011 Gebhardt ............. G01R 33/288
324/307

(Continued)

OTHER PUBLICATIONS

Grissom et al., "Spatial Domain for the Design of RF Pulses in Multicoil Parallel Excitation," Magnetic Resonance in in Medicine, vol. 56 (2006) pp. 620-629.

(Continued)

*Primary Examiner* — Rodney Bonnette
(74) *Attorney, Agent, or Firm* — Schiff Hardin LLP

(57) ABSTRACT

In a method and a control sequence determination device for determining a magnetic resonance system control sequence includes at least one radio-frequency pulse train to be emitted by a magnetic resonance system, a target magnetization is acquired and a k-space trajectory is determined. A radio-frequency pulse train for the k-space trajectory is then determined in an RF pulse optimization method using a target function, wherein the target function includes a combination of different trajectory curve functions, of which at least one trajectory curve function is based on a trajectory error model. A method for operating a magnetic resonance system uses such a control sequence and a magnetic resonance system has such a control sequence determination device.

14 Claims, 3 Drawing Sheets

(51) Int. Cl.
  *G01R 33/483* (2006.01)
  *G01R 33/565* (2006.01)
(52) U.S. Cl.
  CPC ..... *G01R 33/3852* (2013.01); *G01R 33/4818* (2013.01); *G01R 33/4833* (2013.01); *G01R 33/56572* (2013.01)

(56) References Cited

U.S. PATENT DOCUMENTS

2013/0249549 A1   9/2013   Pfeuffer et al.
2013/0253876 A1   9/2013   Pfeuffer et al.
2014/0292333 A1*  10/2014  Beck .................. G01R 33/543
                                                        324/309

OTHER PUBLICATIONS

Yip et al., "Joint Design of Trajectory and RF Pulses for Parallel Excitation," Magnetic Resonance in Medicine, vol. 58 (2007) pp. 598-604.

Setsompop et al., "Magnitude Least Squares Optimization for Parallel Radio Frequency Excitation Design Demonstrated at 7 Tesla With Eight Channels," Magnetic Resonance in Medicine, vol. 59 (2008) pp. 908-915.

Yoon et al., "Fast Joint Design Method for Parallel Excitation Radiofrequency Pulse and Gradient Waveforms Considering Off-Resonance," Magnetic Resonance in Medicine (2012).

Schneider et al., "Robust Spatially Selective Excitation Using Radiofrequency Pulses Adapted to the Effective Spatially Encoding Magnetic Fields," Magnetic Resonance in Medicine, vol. 65 (2011), pp. 409-421.

Wu et al., "Parallel Excitation in the Human Brain at 9.4 T Counteracting k-Space Errors With RF Pulse Design," Magnetic Resonance in Medicine, vol. 68 (2010), pp. 524-529.

Zheng et al., "Parallel transmission RF pulse design for eddy current correction at ultra high field," Journal of Magnetic Resonance, vol. 221 (2012), pp. 139-146.

Tan et al., "Estimation of k-Space Trajectories in Spiral MRI," Magnetic Resonance in Medicine, vol. 61 (2009), pp. 1396-1404.

Bernstein et al., "Handbook of MRI Pulse Sequences," pp. 319-323 (2004).

\* cited by examiner

METHOD AND APPARATUS FOR DETERMINATION OF A MAGNETIC RESONANCE SYSTEM CONTROL SEQUENCE

BACKGROUND OF THE INVENTION

Field of the Invention

The invention concerns a method and a control sequence determination device to determine a magnetic resonance system control sequence. Moreover, the invention concerns a method to operate a magnetic resonance system using such a magnetic resonance system control sequence, as well as a magnetic resonance system with a radio-frequency transmission device, with a gradient system, and a control device designed in order to emit a radio-frequency pulse train to implement a desired measurement on the basis of a predetermined control sequence, and in coordination with this to emit a gradient pulse train.

Description of the Prior Art

In a magnetic resonance (MR) tomography system (shortened to "magnetic resonance system"), the body to be examined is typically exposed to a relatively high basic field magnet field (what is known as the $B_0$ field)—for example 3 or 7 Tesla—with the use of a basic field magnet system. In addition, a magnetic field gradient is applied with the use of a gradient system. Radio-frequency excitation signals (RF signals) are then emitted via a radio-frequency transmission system by suitable antenna devices, which cause nuclear spins of specific atoms or molecules in the subject to be excited to resonance, so as to be flipped (deflected) by a defined flip angle relative to the magnetic field lines of the basic magnetic field. This radio-frequency excitation and the resulting flip angle distribution are also designated in the following as a nuclear magnetization, or "magnetization" for short. Upon relaxation of the nuclear spins, radio-frequency signals (known as magnetic resonance signals) are radiated that are received by means of suitable reception antennas and then are processed further. The desired image data can ultimately be reconstructed from the raw data acquired in such a manner. The emission of the radio-frequency signals (what is known as the $B_1$ field) for nuclear magnetic resonance magnetization most often takes place by using an antenna known as a "whole-body coil" that is permanently arranged in the apparatus, around the measurement space (patient tunnel). The reception of the magnetic resonance signals most often takes place with the use of antennas known as local coils that are positioned more closely to the body of the patient. In principle, however, the reception of magnetic resonance signals with the whole-body coil and/or a transmission of the RF signals with the local coils can also take place.

For a specific measurement, a magnetic resonance system control sequence ("control sequence" for short) is defined within an overall operational procedure for the MR system known as a measurement protocol, which also includes additional control specifications, such as a control sequence typically includes a radio-frequency pulse train to be emitted and a gradient pulse train that is switched (activated) in coordination with the RF pulse train. The gradient pulse train has matching gradient pulses in a volume selection direction, for example slice selection direction or slab selection direction, for example in phase coding direction(s) and in the readout direction, often in the z-direction, y-direction and z-direction. This measurement protocol can be created in advance and be retrieved (from a memory, for example) for a specific measurement and be modified by the operator on site as necessary. During the measurement, the control of the magnetic resonance system then takes place wholly automatically on the basis of this control sequence, wherein the control device of the magnetic resonance system reads out the commands from the measurement protocol and executes them.

To generate the control sequence, usually the individual RF pulse trains (i.e. the RF trajectories) are determined in an optimization method for the individual transmission channels over time, depending on a "transmission k-space trajectory" that is typically predetermined by a measurement protocol, or individually by an operator. The "transmission k-space trajectory" (in the following abbreviated only to "k-space trajectory" or "trajectory") designates with the locations in k-space into which raw data samples are entered by adjusting the individual gradients at specific times. The memory organized as k-space is the spatial frequency domain, and the trajectory in k-space describe the path k-space that is chronologically traversed given emission of an RF pulse by switching of the gradient pulses. By adjustment of the k-space trajectory, it can thus be determined at which spatial frequencies specific RF energy quantities are deposited.

Currently measured $B_1$ maps (that respectively indicate the spatial $B_1$ field distribution for a defined antenna element) and a $B_0$ map (that represents the off-resonances or deviation of the $B_0$ field from the actual desired homogeneous $B_0$ field with spatial resolution, i.e. the actual sought Larmor frequency) can additionally be taken into account in the optimization method to generate the control sequences. Moreover, for the planning of the RF pulse series the user often provides a target magnetization, for example a desired flip angle distribution. With a suitable RF pulse optimization program, the matching RF pulse series is then calculated so that the target magnetization is achieved. In many cases, this is an optimally homogeneous magnetization in the desired field of view (FoV) to be examined, or the desired region to be excited (FoE, Field of Excitation). In-between it is also possible to selectively excite entire defined regions, for example two-dimensionally within a slice or even three-dimensionally, meaning that a non-homogeneous target magnetization is deliberately sought.

A target function is normally set for the RF pulse optimization method or the RF pulse optimization program that is used for this, in which target function the transverse target magnetization is represented in a linear matrix equation system composed of the spatial coil profiles and the multi-channel radio-frequency pulse series; information about the present $B_0$ maps and $B_1$ maps and the k-space trajectory that is used also normally enter into the RF pulse optimization method or program. The matrix used in the target function or in the matrix equation system is also designated as an "A-matrix" (since the symbol "A" is typically used for it) or "system matrix" (since it depends on the spatial coil profiles, and thus on the system that is used). In the optimization method, this equation system can then be solved numerically for a defined, predetermined target magnetization in order to achieve the matching radio-frequency pulse series. One example of this procedure is found in the article "Magnitude Least Square Optimization for Parallel Radio Frequency Excitation Design Demonstrated at 7 Tesla with Eight Channels" by K. Setsompop et al., Magn. Reson. Med. 59: 908 to 915, 2008.

Relatively well-optimized radio-frequency pulse trains for a given transmission k-space trajectory can be determined with this method. However, in practice a problem is that these calculations always assume that the trajectory is ideally implemented precisely as it is mathematically defined in the optimization method. However, it is actually the case that the transmission k-space trajectory can differ significantly from the predetermined trajectory upon execution of the sequence. Typical reasons for this are the inadequacies of the gradient system hardware, for example delays, jitter, discretization errors or additional gradient terms that can occur because of induced eddy currents or other effects such as mixing Maxwell terms of different gradient coils. Due to these deviations, not-insignificant blurring, ghost images or geometric distortions of the achieved magnetization or the generated image data can occur between the ideal trajectory curve assumed during the RF pulse optimization method and the trajectory curve that is actually present upon the later emission of the radio-frequency pulse train.

In order to take such deviations of the trajectories or gradients into account, relatively complicated methods could in principle be implemented. For example, in a two-stage method the k-space trajectory is initially traversed once with the predetermined activation data, and the k-space trajectory that is actually achieved are thereby measured. This measured k-space trajectory can then be used within the RF pulse optimization method. The current measurement data could also be used in order to determine error models for the gradient errors. However, all of these methods require a prior measurement of the actual emitted trajectories, which is very time-consuming.

SUMMARY OF THE INVENTION

An object of the present invention to specify a method to determine a magnetic resonance system control sequence, as well as a corresponding control sequence determination device, that more simply takes into account possible errors in the k-space trajectory curve.

In the method according to the invention, a desired target magnetization is initially acquired. A current $B_0$ map and, if necessary, current $B_1$ maps can optionally also be acquired.

A k-space trajectory is then determined, for example by adoption from a measurement protocol or by acquisition via a user interface at which an operator enters the k-space trajectory type as an input. Alternatively, other methods to determine a current k-space trajectory can also be used; for example, only one k-space trajectory type (i.e. the type of k-space trajectory, for example whether it is a spiral trajectory, a straight-line (rectilinear) trajectory for an EPI sequence (EPI=echoplanar imaging), known as radial trajectories with concentrically skewed spokes, etc.) is acquired, and then an automatic determination of an optimal k-space trajectory of this trajectory type takes place.

The determination of the radio-frequency pulse train for the k-space trajectory then subsequently takes place in an RF pulse optimization method.

The determination of the radio-frequency pulse train can in principle take place as in the conventional method, for example, with the method described above as explained in Setsompop et al., but with the difference that now the target function includes a combination of different k-space trajectory curve functions, of which at least one trajectory curve function is based on a trajectory error model. A combination of an ideal form and at least one error model, or preferably even a combination of different error models, thus now enters into the target function.

Within the RF pulse optimization method, a high bandwidth of hypothetical gradient errors that could occur within the subsequent measurement can thus be covered, such that the optimized radio-frequency pulse shape or the radio-frequency pulse train that is obtained is less sensitive with regard to such gradient errors. As will be explained in more detail below, data of a current measurement of the trajectory curve that is actually achieved can be foregone via this combination of different models. The method according to the invention is thus rapid, as well as robust, in the calculation. This consequently leads to a speed improvement, and to a better image quality in the overall measurement.

A control sequence determination device according to the invention has an input interface arrangement to receive a predetermined target magnetization, and possibly to receive a current $B_0$ map and/or current $B_1$ maps. Such an interface arrangement can be composed of multiple different interfaces that each receive the appertaining data, or can be a combined interface that is able to accept multiple data types. A reception of the data encompasses an acceptance of data from other components of the magnetic resonance system, for example a user interface or from a memory unit with a database etc., or an acceptance from a measurement device or reconstruction device of the magnetic resonance system. For example, the input interface arrangement can be a user interface for manual input of a target magnetization, in particular a graphical user interface. It can also be an interface in order to select and accept data from a data storage arranged within the control sequence determination device or connected with this via a network, possibly also using the user interface.

Furthermore, a trajectory determination unit is required to determine a k-space trajectory. It can also be an interface with which (for example) a k-space trajectory that is specified set by a user can be entered, or a determination device that determines this k-space trajectory on the basis of a predetermined trajectory type. Such an interface can also be part of the aforementioned interface arrangement.

An RF pulse optimization unit is required to determine the radio-frequency pulse train for the k-space trajectory using a predetermined target function, wherein the target function includes a combination of different k-space trajectory curve functions, of which at least one trajectory curve function is based on a trajectory error model. For this purpose, the RF pulse optimization unit comprises a special target function determination unit as well as a suitable interface or the like in order to determine or accept error models that can then be adopted into the target function with the use of the target function determination unit.

Moreover, the control sequence determination device should have a suitable control sequence output interface in order to pass the control sequence to other control units of the magnetic resonance tomography system. For example, the control sequence output interface can be an interface that transmits the control sequence to a magnetic resonance controller in order to therefore directly control the measurement, but also an interface that sends the data over a network and/or stores the data in a memory for later use.

In a method according to the invention for the operation of a magnetic resonance system, a control sequence is determined according to the method described above, and then the magnetic resonance system is operated using this control sequence. A magnetic resonance system of the aforementioned type according to the invention accordingly has a control sequence determination device as described above.

Significant portions of the control sequence determination device can be designed in the form of software components. This is particularly the case for the trajectory determination unit and the RF pulse optimization unit or their components, for example a target function determination unit. The aforementioned interfaces can likewise be designed at least in part in the form of software and may possibly be hardware interfaces of an existing computer. The invention thus also encompasses a non-transitory, computer-readable data storage medium encoded with program code that can be loaded directly into a memory of a control sequence determination device, with program code segments in order to execute all steps of the method according to the invention when the program code is executed in the control sequence determination device. Such a realization has the advantage that previous devices that are used to determine control sequences (for example suitable computers in computing centers of the magnetic resonance system manufacturers) can also be suitably modified b implementation of the program code in order to determine fast and robustly optimized control sequences in the manner according to the invention.

As noted, in a simplified variant it is possible for the target function, as before to include an "ideal model" for an ideal trajectory curve, i.e. a model with the assumption that no gradient error occurs, and the target function additionally to include a trajectory curve function that is based on a trajectory error model. However, the target function preferably includes different trajectory curve functions that are based on different trajectory error models.

The different trajectory error models can be based on the same trajectory error model type, wherein different error parameters (for example possible delay times, scaling factors etc.) can be used in this error model type, for example. As used herein, a "trajectory error model type" means that the error model type is based on a specific, typical theoretical error, for example is an error due to an incorrect amplitude scaling, an error due to eddy currents etc.

At least one of the following error types is preferably modeled with at least one of the trajectory error model types:
  amplitude scaling errors (wrong amplitude scaling). These are errors that, for example, can occur through the digital/analog conversion, through a nonlinear property of the gradient coil/power amplifier, etc.
  eddy current errors (eddy current models). These are errors that are caused by eddy currents in adjacent gradient coils, in the patient table, in the shielding etc., and can lead to additional $B_0$ terms and gradient terms in the measurement.
  gradient delay errors (gradient delay model). These are errors that can occur via different delays of the currents in the individual gradient coils in the x-, y- and z-direction relative to one another.
  basic magnetic field errors (static/dynamic $B_0$ field effect model). These are errors that occur due to superimposed contamination effects of an inhomogeneous basic magnetic field (for example via introduction of an object with different susceptibilities into the field). Such errors also lead to the situation that the basic magnetic field is locally not as intended.
  gradient mixed term effects (concomitant field effect model). These are errors that can occur due to higher order mixed Maxwell terms between gradient fields of the different coils in the x-, y- and z-direction.
  coupling effects (coupling effect models). These are errors that can occur via a crosstalk between the different gradient coils.

It is thereby possible to construct a trajectory error model type separately for each of these error types, meaning that a trajectory error model type models precisely one such error type. However, in principle it is also possible to develop a trajectory error model type that models multiple such error types in combination, as this is also shown later.

Furthermore, it is also preferable for different trajectory error models to be based on different trajectory error model types, meaning that a combination of different error model types then also enters into the target function.

As explained above, it is preferred that the trajectory error models (and therefore also the trajectory error model types) are completely independent of current measurement data of the k-space trajectory, i.e. of data measured in advance for the current measurement situation.

Independent of whether the different trajectory error models are based on the same trajectory error model type and have only different error parameters, or whether the trajectory error models are also based on different trajectory error model types, these can enter into the target function with a predetermined weighting, which means that (for example) a specific error type can be more strongly weighted than other error types. For this purpose, simple weighting factors for each trajectory error model or each trajectory error model type can predetermined within the target function.

Classically, the radio-frequency pulses are emitted only via one transmission channel and then are fed in a suitable manner into the whole-body coil. For example, it is hereby possible to split the radio-frequency signal, and to feed the partial signals—amplitude- and phase-shifted by 90° relative to one another and accordingly spatially offset—into a whole-body coil constructed in the form of a birdcage antenna, such that then a circularly polarized (only phase) or elliptically polarized (amplitude and phase)—in the optimal case, homogeneous—$B_1$ field is emitted. Given newer magnetic resonance systems, it is possible in the meanwhile to populate the individual transmission channels (for example the individual rods of a cage antenna) with individual RF signals adapted to the imaging. For this purpose, a multichannel pulse train is emitted that is comprised of multiple individual radio-frequency pulse trains that can be emitted in parallel via the different independent radio-frequency transmission channels. Such a multichannel pulse train (also designated as a "pTX pulse" due to the parallel emission of the individual pulses) can be used as an excitation pulse, refocusing pulse and/or inversion pulse. For example, a method to develop such multichannel pulse trains in parallel excitation methods is described by W. Grissom et al.: "Spatial Domain Method for the Design of RF Pulses in Multicoil Parallel Excitation", Mag. Res. Med. 56, 620-629, 2006.

The method according to the invention offers particular advantages within the scope of such pTX methods, wherein the advantage increases even further with the number of transmission channels that are used. The method is therefore preferably also used so that the magnetic resonance system control sequence created according to the invention includes a multichannel pulse train with multiple individual RF pulse trains that are to be emitted in parallel by the magnetic resonance tomography system via different independent radio-frequency transmission channels. The determination of the multichannel pulse train then particularly preferably also takes place on the basis of $B_1$ maps which respectively indicate the distribution of the $B_1$ field for the individual transmission channels. In principle, however, the method can also be used very well in connection with classical methods and systems with a transmission channel, wherein the current $B_1$ map is also possibly not measured in addition, but rather exists via assumption or, respectively, modeling.

In particular, the method is also usable in a multidimensional radio-frequency shimming method in which—although multiple independent transmission channels are used—as has already been described in the preceding a common radio-frequency pulse train is used that is output to the different transmission channels, amplitude-shifted and phase-shifted relative to one another, and is emitted by these in order to thus generate a desired spatial field distribution.

In principle, there are a variety of possibilities to incorporate the trajectory error models into the target function. Insofar as the target function is (as described above) constructed by means of an A-matrix or system matrix, an A-matrix that is expanded relative to the prior art (for example according to Setsompop et al.) is preferably used that includes multiple different sub-matrices or is formed from these. These different sub-matrices are then based on different trajectory curve functions. In other words: the matrix elements of the sub-matrices are designed so that they include the different trajectory curve functions that are in turn respectively based on the different trajectory error models. Each sub-matrix can thereby correspond to a complete A-matrix of the conventional target function, meaning that—for example given k transmission channels and 1 sampling points of the RF pulse or RF pulse segment that is optimized with the target function, which RF pulse or, respectively, RF pulse segment is considered within the RF pulse optimization function or partial function—it can accordingly have k rows and k·1 rows. This is explained again in detail later using an exemplary embodiment.

Insofar as an ideal trajectory curve function should also be taken into account, in this case one of the sub-matrices can be based on the ideal trajectory curve function which proceeds from an error-free trajectory curve. In this case, only the known A-matrix is thus additionally expanded by one or more additional sub-matrices that are respectively based on the different error models.

The method according to the invention can be used given arbitrary k-space trajectories or, respectively, trajectory types in two-dimensional or three-dimensional k-space, in particular and preferably with EPI trajectories or spiral geometries, but also with cycloid geometries, spoke position geometries, radial geometries, spherical shell geometries, kT points or freeform geometries.

The calculation of the radio-frequency pulse train within the scope of the RF pulse optimization method particularly preferably initially takes place for a lower target magnetization. The multichannel pulse train that is thereby determined is subsequently scaled up to an ultimate target magnetization and is post-corrected again as necessary. For this procedure it is utilized that the magnetization response is still linear for small magnetizations, i.e. for small flip angles (in what is known as the "low flip range"), for example between 0° and 5°. Therefore, in this range a calculation with an optimization method is significantly simpler and faster. If the optimal multichannel pulse train is found for this range, an upscaling is possible without further measures in a subsequent step. For example, if the calculation in the low flip range takes place for a flip angle of at most $\alpha=5°$, and the actual magnetization should take place with a flip angle $\alpha$ of at most 90°, the amplitude values of the RF pulses can by multiple by a factor of 18 (corresponding to the ratio of the flip angles).

Since, within the scope of the method, a determination of an optimal radio-frequency pulse train can be implemented by means of conventional RF pulse optimization methods in addition to the optimization of the k-space trajectory according to the invention, additional parameters (in particular with regard to a physical RF exposure value of the examination subject) can thereby also preferably be optimized. For example, the parameters used for the RF pulse optimization can still be varied later within a Tikhonov regularization, or other system parameters such as (for example) the maximum gradient strength or the edge time, can also still be varied later within the scope of the optimization in order to thus also achieve results that are optimized with regard to the SAR values or SED values.

DESCRIPTION OF THE PREFERRED EMBODIMENTS

Figure 1:
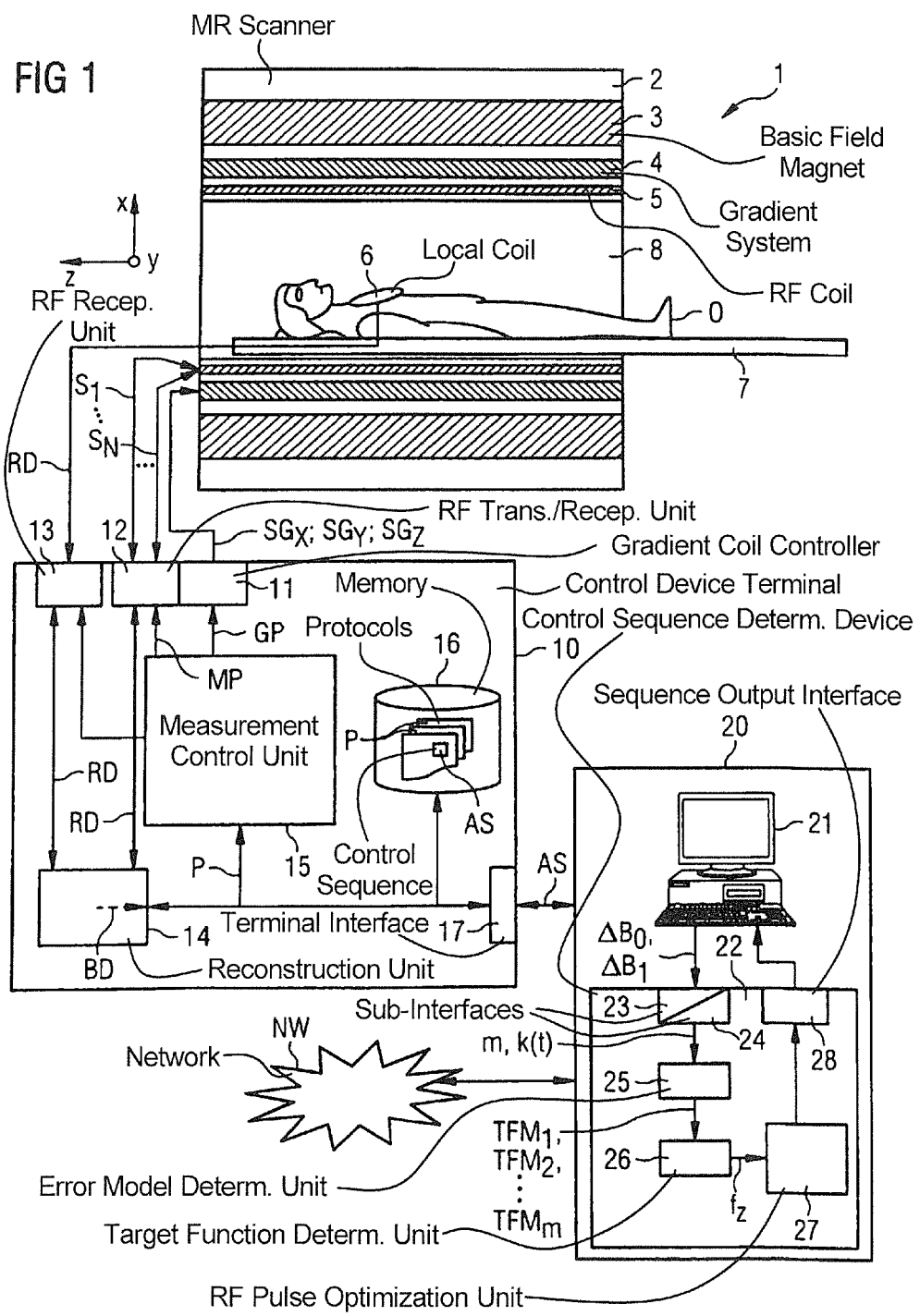
FIG. 1 is a schematic depiction of an exemplary embodiment of a magnetic resonance system according to the invention.

A magnetic resonance system 1 according to the invention is schematically depicted in FIG. 1. The system includes the actual magnetic resonance scanner 2 with an examination space 8 or patient tunnel therein. A bed 7 can be driven into this patient tunnel 8 so that, during an examination, an examination subject 0 (patient/test subject) lying on said bed 7 can be supported at a defined position within the magnetic resonance scanner 2 relative to the magnet system and radio-frequency system arranged therein, or can be driven between different positions during a measurement.

Basic components of the magnetic resonance scanner 2 are a basic field magnet 3, a gradient system 4 with magnetic field gradient coils in order to apply arbitrary magnetic field gradients in the x-, y- and z-directions, and a whole-body radio-frequency coil 5. The reception of magnetic resonance signals induced in the examination subject O can take place via the whole-body coil 5 with which the radio-frequency signals are normally also emitted to induce said magnetic resonance signals. However, these signals are typically received with local coils 6 placed on or below the examination subject O. All of these components are known in principle to those skilled in the art, and therefore are only schematically shown in FIG. 1.

Here the whole-body radio-frequency coil 5 is designed in the form of a birdcage antenna and has a number N of individual antenna rods that proceeds parallel to the patient tunnel 8 and are arranged distributed uniformly on a periphery around the patient tunnel 8. At the ends, the individual antenna rods are each connected capacitively in the form of a ring. The individual antenna rods are separately controllable by a control device 10 as individual transmission channels $S_1, \ldots, S_N$, which means that the magnetic resonance tomography system is a pTX-capable system. However, the method according to the invention is also applicable to classical magnetic resonance tomography apparatuses with only one transmission channel. Since the method according to the invention offers particular advantages given pTX sequences, in the following such an example is assumed (insofar as it is not stated otherwise), without limitation of the generality.

The control device 10 can be a control computer that can be composed of a number of individual computers (which may be spatially separated and connected among one another via suitable cables or the like). This control device 10 is connected via a terminal interface 17 with a terminal 20 via which an operator can control the entire magnetic resonance system 1. In the present case, this terminal 20 is equipped as a computer with keyboard, one or more screens 28 as well as additional input devices (for example a mouse or the like) so that a graphical user interface is provided to the operator.

Among other things, the control device 10 has a gradient control unit 11 that can in turn be composed of multiple sub-components. The individual gradient coils are supplied via this gradient control unit 11 with control signals $SG_x$, $SG_y$, $SG_z$. These represent gradient pulses that, during a measurement, are activated at precisely set time positions and with a precisely predetermined time curve.

Moreover, the control device 10 has a radio-frequency transmission/reception unit 12. This RF transmission/reception unit 12 likewise has multiple sub-components in order to feed radio-frequency pulses separately and in parallel to the individual transmission channels $S_1, \ldots, S_N$, i.e. to the individually controllable antenna rods of the body coil. Magnetic resonance signals can also be received via the transmission/reception unit 12. However, this typically occurs with the aid of the local coils 6. The raw data RD acquired with these local coils 6 are read out and processed by an RF reception unit 13. The magnetic resonance signals received by these (or by the whole body coil) by means of the RF transmission/reception unit 12 are passed as raw data RD to a reconstruction unit 14, which reconstructs the image data BD from these and stores these in a memory 16 and/or passes them to the terminal 20 via the interface 17 so that the operator can view them. The image data BD can also be stored and/or displayed and evaluated at other locations via a network NW. Insofar as the local coils have a suitable switching unit, these can also be connected to an RF transmission/reception unit in order to also use the local coils to transmit.

The gradient coil controller 11, the RF transmission/reception unit 12 and the reception unit 13 for the local coils 6 are respectively controlled as coordinated by a measurement control unit 15. Via corresponding commands, this ensures that a desired gradient pulse train GP is emitted via suitable gradient coil signals $SG_x$, $SG_y$, $SG_z$ and controls the RF transmission/reception unit 12 in parallel so that a multichannel pulse train MP is emitted, meaning that the radio-frequency pulses matching the individual transmission channels $S_1, \ldots, S_N$ are provided in parallel to the individual transmission rods of the whole-body coil 5. Moreover, it must be ensured that the magnetic resonance signals are read out at the local coils 6 via the RF reception unit 13 or, respectively, that possible signals are read out at the whole-body coil 5 via the RF transmission/reception unit 12 at the matching point in time and are processed further. The measurement control unit 15 provides the corresponding signals—in particular the multichannel pulse train MP—to the radio-frequency transmission/reception unit 12 and the gradient pulse train GP to the gradient control unit 11 according to a predetermined control protocol P. In this control protocol P, all control data are stored that must be set during a measurement according to a predetermined control sequence AS.

A number of control protocols P for different measurements are typically stored in a memory 16. These could be selected by the operator via the terminal 20 and possibly be varied in order to then provide for the currently desired measurement a matching control protocol P with which the measurement control unit 15 can operate. Moreover, the operator can also retrieve control protocols P (for example from a manufacturer of the magnetic resonance system) via a network NW and can then modify and use these as necessary.

The basic workflow of such a magnetic resonance measurement and the cited components for control are known to those skilled in the art, and thus need not be described in further detail herein. Moreover, such a magnetic resonance scanner 2 as well as the associated control device 10 can still have a number of additional components that are likewise not explained in detail herein. It is noted that the magnetic resonance scanner 2 can be of a different design, for example with a laterally open patient space, and that in principle the radio-frequency whole-body coil does not need to be designed as a birdcage antenna.

Moreover, a control sequence determination device 22 according to the invention that serves to determine a magnetic resonance system control sequence AS is schematically depicted here in FIG. 1. Among other things, for a specific measurement this magnetic resonance system control sequence AS includes a pulse sequence with a gradient pulse train GP in order to traverse a specific trajectory in k-space, as well as a radio-frequency pulse train (here a multichannel pulse train MP) coordinated with this to control the individual transmission channels $S_1, \ldots, S_N$. In the present case, the magnetic resonance system control sequence AS is created as part of the control protocol P.

Here the control sequence determination device 22 is depicted as part of the terminal 20 and can be realized in the form of software components at the computer of this terminal 20. In principle, however, the control sequence determination device 22 can also be part of the control device 10 itself, or be realized at a separate computer system, and the finished control sequences AS are transmitted via a network NW to the magnetic resonance system 1 (possibly also within the framework of a complete control protocol P).

Here the control sequence determination device 22 has an input interface arrangement 23, 24 which can be composed of multiple sub-interfaces, where here is symbolized by the 2 reference characters 23, 24. Via this input interface arrangement 23, 24, the control sequence determination device 22 receives a target magnetization m that predetermines what the flip angle distribution should be in the desired measurement. The control sequence device also receives a transmission k-space trajectory k(t), and may receive a $B_0$ map $\Delta B_0$; multiple $B_1$ maps $\Delta B_1$, and possible additional input parameters that are explained again in detail below in connection with FIG. 2.

With an error model determination unit 25 (shown separately here), a trajectory error model $TFM_1$, $TFM_2, \ldots, TFM_m$ or multiple trajectory error models $TFM_1$, $TFM_2, \ldots, TFM_m$ or a combination of trajectory error models $TFM_1$, $TFM_2, \ldots, TFM_m$ that is/are to be considered is/are selected. This error module determination unit 25 can also be an interface, for example a part of the input interface arrangement. However, it can also be a memory in which finished trajectory error model types or the like are stored and into which, for example, only parameters for trajectory error models $TFM_1$, $TFM_2, \ldots, TFM_m$ that are defined via a user interface are to be input, or these parameters are selected depending on the desired control sequence (for example the type of sequence and the type of trajectory), for example. It is normally the case that specific error types can occur with specific types of trajectories.

All of these data are then passed to a target function determination unit 26 which determines a suitable target function $f_z$ that then includes the desired combination of different k-space trajectory curve functions that are based on the defined trajectory error models $TFM_1$, $TFM_2$, ..., $TFM_m$. The determined target function $f_z$ is then passed to an RF pulse optimization unit 27 in which an optimal radio-frequency pulse train MP is then determined for the desired trajectory using the predetermined target function $f_z$.

The data that define this radio-frequency pulse train MP and the selected trajectory k(t) are then emitted as an output via a control sequence output interface 28 and can then be provided to the control device 10, for example within the scope of a control protocol P in which additional specifications for controlling the magnetic resonance system 1 are indicated (for example parameters for reconstruction of the images from the raw data etc.).

Figure 2:
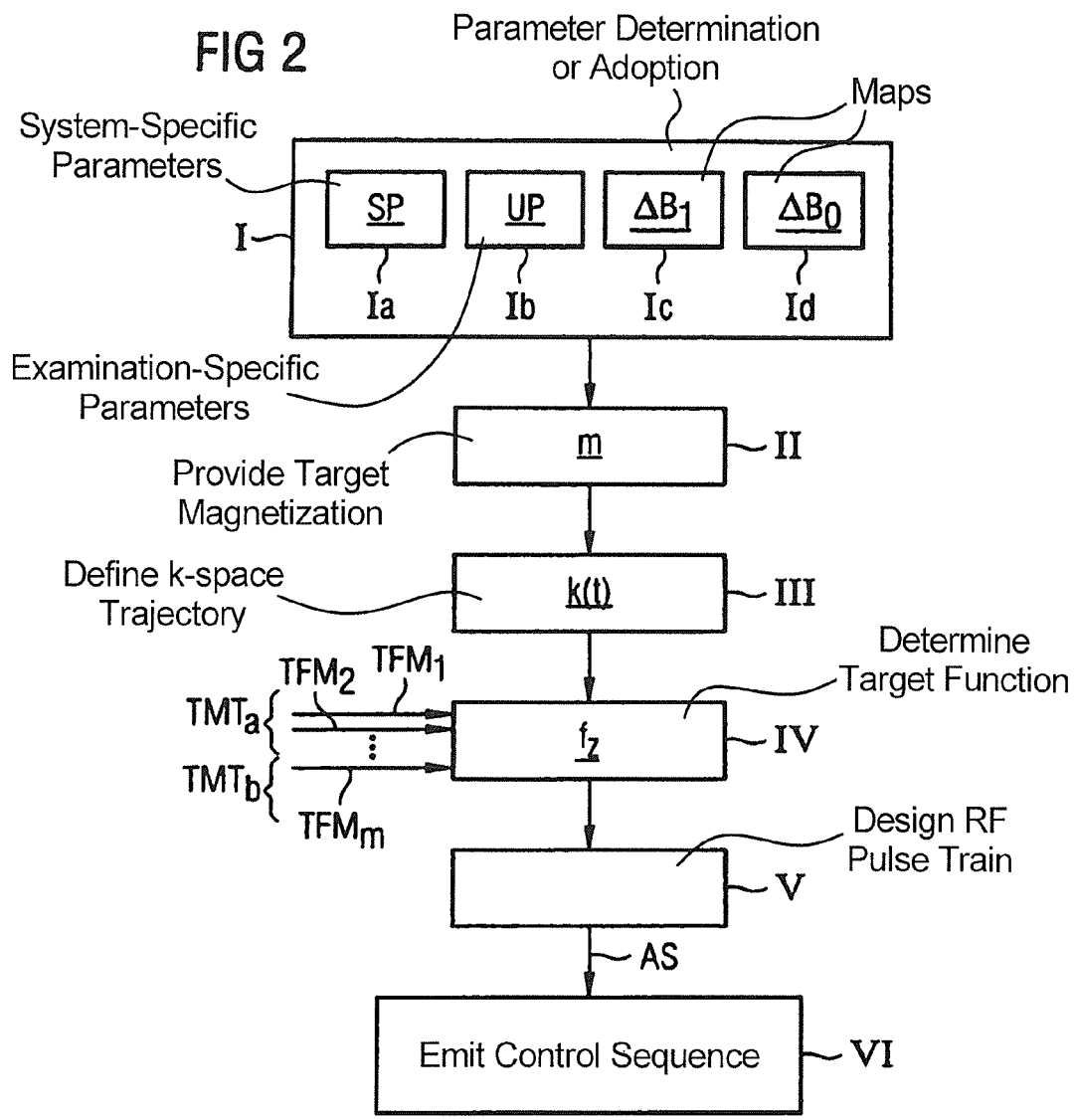
FIG. 2 is a flowchart of an exemplary embodiment of the method according to the invention for determination of a control sequence.

In the following, the workflow of a method according to the invention for determining a magnetic resonance system control sequence AS is explained in a simplified example using the workflow diagram according to FIG. 2.

In step I, different parameters used within the further method are initially predetermined or, respectively, adopted. For example, in step Ia system-specific parameters SP (such as the number of transmission channels, a maximum slew rate, a maximum gradient amplitude etc.) are adopted; in step Ib, different examination-specific parameters UP (such as the positioning of the slices etc. to be acquired) are adopted; and in step Ic, the $B_1$ maps $\Delta B_1$ for the individual transmission channels are adopted. Moreover, in step Id a currently measured $B_0$ map $\Delta B_0$ can be provided. In step II, a desired target magnetization m is provided. Finally, in step III a k-space trajectory k(t) is defined, for example by specification of a fixed k-space trajectory k(t) or via specification of a trajectory type, and subsequent determination of an optimized k-space trajectory k(t) of this type. The specification of the trajectory or of the type can take place via the selected control protocol since the trajectory often depends on the type of measurement. The method steps Ia through Id, II and III can also be executed in a different order.

The design of the radio-frequency pulse train (here a multichannel pulse train MP) then takes place automatically in step V after the determination of the target function $f_z$ in step IV. The individual RF pulse series for the different transmission channels are hereby developed, which means that which RF pulse train must be sent at which channel is calculated precisely. An iterative optimization method is applied since this has proven to be particularly suitable. Specifically, the known conjugate gradient method (CG method, or method of conjugated gradients) is used. In principle, however, other optimization methods (also non-iterative methods) are also usable.

This can take place with arbitrary methods. In many known methods, the optimization method takes place so that (for example) the quadratic mean deviation (least mean square) between the target magnetization and the real magnetization is minimized. This means that a solution is sought for the following target function $f_z$:

$$b = \arg_b \min\{\||m_{ist}| - m\|_w^2 + R(b)\} \quad (1)$$

The target magnetization is thereby m, and $m_{real} = A \cdot b$ is the (theoretical) real magnetization achieve via an RF pulse train p, wherein A is what is known as the A-matrix, comprised of a system of linear complex equations into which the spatial coil profiles and the present $B_0$ maps and $B_1$ maps and the k-space trajectory that is used are entered. For example, an A-matrix (also called system matrix or design matrix) that is typically used is described by W. Grissom et al.: "Spatial Domain Method for the Design of RF Pulses in Multicoil Parallel Excitation", Mag. Res. Med. 56, 620-629, 2006. b is a (time-dependent) vector that includes the (for example) N functions $b_c$ (a time-dependent function of the RF amplitude for each transmission channel c=1 through N). R(b) is an (optional) regularization term, preferably a Thikonov regularization. W defines the volume of interest (region of interest), i.e. the volume that is to be achieved via the RF pulse series.

Equation (1) or the target function $f_z$ (the part to be minimized within the curly brackets) that is used therein or its A-matrix here is set up beforehand in a manner according to the invention in step IV so that the target function $f_z$ includes a combination of different trajectory curve functions, of which at least one trajectory curve function is based on a trajectory error model $TFM_1$, $TFM_2$, ..., $TFM_M$. In this way it can be taken into account that the actual gradient pulse shapes that are executed later do not need to coincide with the previously calculated theoretical gradient pulse shapes, and therefore the k-space trajectory can differ from the theoretically calculated desired k-space trajectory.

The way that the trajectory curve functions enter into the A-matrix is shown in the mathematical definition of their individual matrix elements $a_{ij}$, which here is as follows:

$$a_{ij} = i\gamma m_0 \Delta t e^{ir_j k(t_j)} e^{i\gamma \Delta B_0(r_i)(t_j - T)} \quad (2)$$

In this equation, i and j are rows/columns of the A-matrix or, respectively, the i-th spatial and j-th temporal sample point; γ is the gyromagnetic ratio; $m_0$ is the steady state magnetization, i.e. likewise a material constant; r is the spatial coordinates within k-space; $\Delta B_0$ is the value of the $B_0$ map at the location $r_i$; $\Delta t$ is the discrete sampling time interval; and T is the pulse length, i.e. the duration to traverse the trajectory k(t) (all partial pulses thereby form a single common "RF pulse" along a k-space trajectory in the sense of this equation). The k-space trajectory or, respectively, the k-space trajectory curve function k(t) is provided as follows:

$$k(t) = -\gamma \int_t^T G(\tau) d\tau \quad (3)$$

wherein G is the gradient amplitude (gradient waveform) at the point in time t. t is hereby simply the integration index, and T is again the pulse length (for example in [s]). The gradient amplitude G is written as a vector since it relates to the gradient amplitude shape in all three spatial directions, i.e. $G_{x,y,z}(t)$ (for example in [mT/m]). k(t) is the position in k-space, indicated as a vector $k_{x,y,z}(t)$ (for example in [1/mm]).

In order to ensure that the target function according to Equation (1) includes a combination of different k-space trajectory curve functions that are based on different trajectory error models, according to the preferred variant of the invention a typical A-matrix is now not used, but rather an A-matrix is used that is comprised of multiple sub-matrices. For this, in Equation (1) the real magnetization $m_{real}$ achieved via an RF pulse train b is defined as follows:

$$\begin{bmatrix} m \\ m \\ \vdots \\ m \end{bmatrix} = \begin{bmatrix} A_{ideal} \\ A_{em1} \\ \vdots \\ A_{emn} \end{bmatrix} b \quad (4)$$

$A_{ideal}$ is the conventional A-matrix as used in the article by Setsompop, for example. This A-matrix describes the case that the k-space trajectory is traversed in an ideal manner, meaning that it assumes an ideal k-space trajectory curve function.

This matrix was expanded by additional sub-matrices $A_{em1}, \ldots, A_{emn}$ which are respectively constructed in the same manner, meaning that each of these sub-matrices $A_{em1}, \ldots, A_{emn}$ is comprised of elements $a_{ij}$ as they are defined in Equation (2). The individual sub-matrices $A_{em1}, \ldots, A_{emn}$ differ only by, instead of the definition of the k-space trajectory curve functions according to Equation (3), the sub-matrix $A_{emi}$ for the i-th error model now being constructed according to $$k_{emi}(t) = -\gamma \int_t^T G_{emi}(\tau) d\tau \tag{5}$$

The gradient amplitudes (gradient waveforms) $G_{emi}(t)$ that are based on errors can thereby be modeled with the use of anisotropic hardware delay times $T_d$ and linear eddy currents $G_{EC}(T)$ according to $$G_{emi}(t) = T_d(G_{ideal}(t) + G_{EC}(t)) \tag{6}$$

The operator $T_d$ defining the delay time is thereby defined as follows:

$$G_d = T_d(G(t)) = \begin{bmatrix} G_x(t-\tau_x) \\ G_y(t-\tau_y) \\ G_z(t-\tau_z) \end{bmatrix} \tag{7}$$

wherein $t_x$, $t_y$, $t_z$ are respectively the delay times in the direction of the x-, y- and z-axis with regard to the RF pulse emission. The operator $T_d$ can be constructed so that it has the same delay times in all spatial directions, but also so that different delay times are provided for each spatial direction.

The operator $G_{EC}$ for definition of the eddy current errors can, for example, be defined as depicted in the following as an example for the x-axis:

$$G_{EC_x}(t) = -\frac{dG_x}{dt} \cdot e_{xx}(t) - \frac{dG_y}{dt} \cdot e_{xy}(t) - \frac{dG_z}{dt} \cdot e_{xz}(t) \tag{8}$$

$e_{xx}(t)$, $e_{xy}(t)$ and $e_{xz}(t)$ are the exponential functions that respectively describe the decay response of the eddy current terms. The last two cross products could optionally also be ignored because the eddy current effects due to cross terms are relatively small in relation to the first term. The first term can then be developed as follows in a linear Taylor series:

$$\begin{aligned} G_{EC_x}(t) &\approx -\frac{dG_x}{dt} \cdot e_{xx}(t) \\ &= -\frac{dG_x}{dt} \cdot \sum_n a_n h(t) \exp(-t/\tau_n) \\ &\approx -\frac{dG_x}{dt} \cdot \sum_n a_n h(t)(1 - t/\tau_n) \end{aligned} \tag{9}$$

wherein $\tau_n$ represents the decay time of the eddy current (for example typically 20-150 µs), $a_n$ is the amplitude of the eddy current (for example typically 1%-2% of the gradient amplitude G) and $$h(t) = \begin{cases} 1 & t \geq 0 \\ 0 & t < 0 \end{cases} \tag{10}$$

Equation (9) can then also be written as follows:

$$G_{EC_x}(t) = AG_x(t) + BG_x(t)t - B\int_0^t \frac{dG_x}{dt'} t' dt' \tag{11}$$

with $$A = -\sum_n a_n \tag{12}$$

and $$B = -\sum_n (a_n/\tau_n) \tag{13}$$

The gradient error model $G_{emi}(t)$ defined according to Equation (6) is an example of a combined error model that takes into account both different gradient delays and eddy currents. Alternatively, it is also possible to construct two different trajectory error model types (gradient error model type), wherein one model type takes into account only the delay times and the other model type takes into account only the delay times, and then define one or more individual sub-matrices for each trajectory error model type, which sub-matrices then enter into the complete A-matrix according to Equation (4).

More elaborate error models or error model types can similarly be used that, for example, also include nonlinear eddy currents, cross products, mixed products between gradient fields of the different coils due to the Maxwell terms, overcoupling effects, or also static or, respectively, dynamic B0 field effects, as well as incorrect amplitude scalings of the gradient coils etc.

For each error model type, multiple error models or, respectively, multiple sub-matrices can thereby also be used according to Equation (4), wherein different error parameters are used in the same error model type. For example, in Equation (4) a first error model for a first sub-matrix $A_{em1}$ could be constructed according to Equation (6), wherein $t_{d1}$=+10 µs is assumed as a delay time in all gradient directions. An additional sub-matrix $A_{em2}$ is likewise constructed according to Equation (6), i.e. with the same error model type, wherein then the delay times are, however, $t_{d2}$=−10 µs etc. For each error model it is thereby also possible to provide different delay times for different spatial directions etc.

In order to keep the calculation times as low as possible, it is in particular also possible to limit the error models that are used to "worst case" error values known a priori, for example (as described above) maximum delay times of +/−10 µs in each gradient direction.

The possibility to construct multiple trajectory error models $TFM_1$, $TFM_2$, . . . , $TFM_M$ on the basis of different trajectory error model types $FMT_a$, $FMT_b$, and to have these enter into the target function $f_z$ in the described manner, is symbolized in FIG. (2). Here it is shown how the first trajectory error models $TFM_1$, $TFM_2$ are based on a first trajectory error model type $FMT_b$, in contrast to which additional trajectory error models $TFM_m$ are based on other trajectory error model types (here the trajectory error model type $FMT_b$).

If the matching target function $f_z$ was set up according to Equations (1) through (13) in step IV, and the solution for this was found in Step V, a function of the amplitude depending on the time for all present transmission channels exists as a result.

The multichannel pulse series can thereby initially be obtained for what is known as the "low flip range" with flip angles below 5°, since in this range the magnetization response still runs linearly. The obtained values are then scaled up in order to achieve the actual desired target magnetization that, for example, goes up to a 90° flip angle. This takes place simply via multiplication of the amplitudes of the individual pulses with the desired scaling factor. The error that can occur upon scaling up can be corrected via a (partial) Bloch simulation.

To conclude, in step VI the control sequence AS is then passed on for caching or immediate execution.

In order to test the method according to the invention, simulations have been calculated in which an L-shaped target magnetization distribution (target flip angle distribution) has respectively been predetermined for a data set of a human torso. In the calculations, a numerical optimization takes place according to the above method, wherein 8 independent transmission channels and an excitation field of 400×600 mm has been assumed. The excitation resolution has been assumed with 10 mm, and what is known as a tick-tock optimizer has been assumed. 15° has been assumed as a target flip angle.

Figure 3:
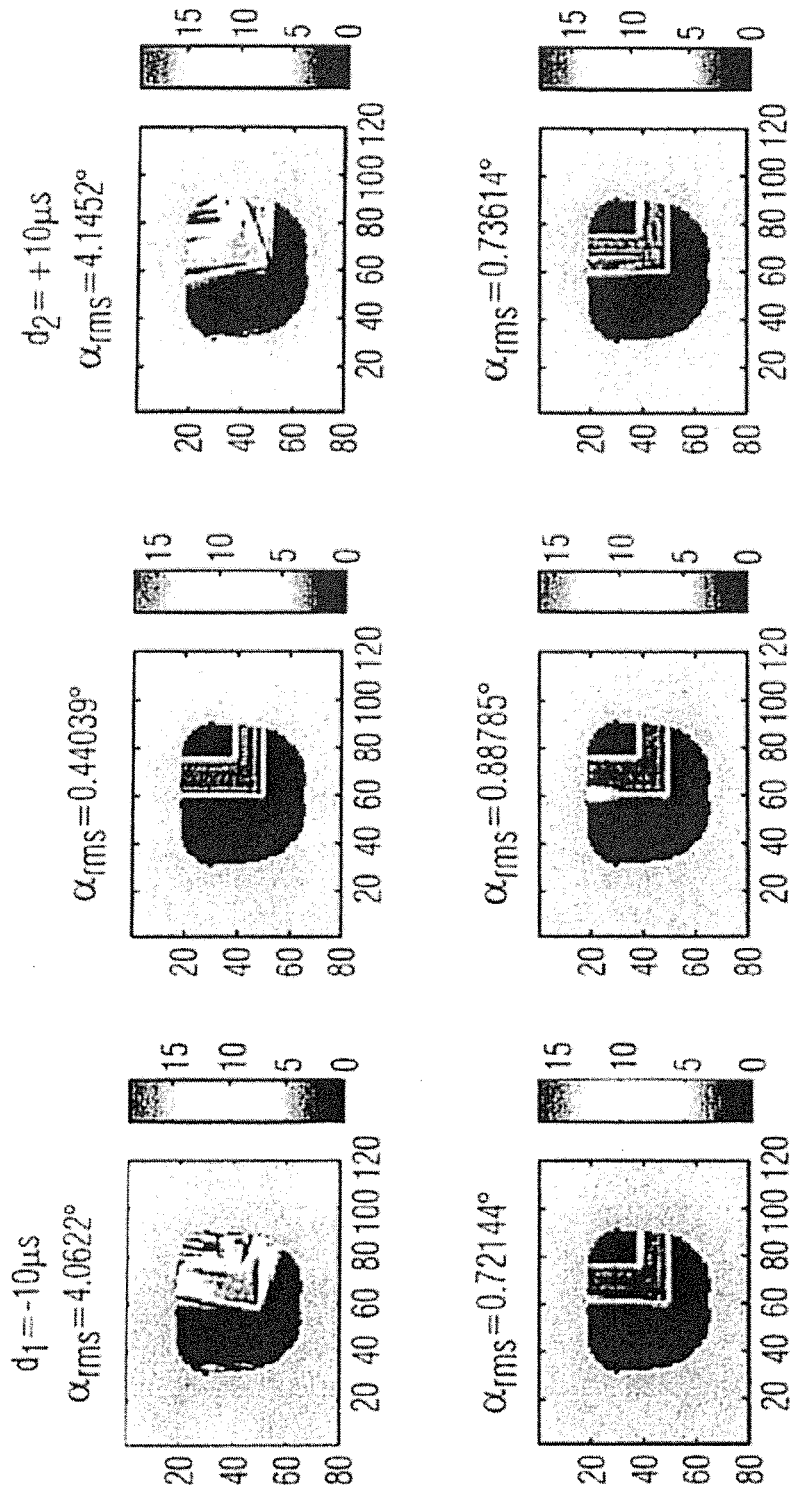
FIG. 3 shows a simulation of the achieved magnetization (given specification of an L-shaped target magnetization) under assumption of different gradient delay and eddy current errors given execution of the gradient pulses in a method without application of the invention (upper images) in comparison to a method with application of the invention (lower images).

FIG. 3 shows the result of these simulations. The images respectively show the spatial distribution of the achieved flip angle within an x/y-plane in positional space, wherein the coordinates on the x-axis and y-axis are indicated in pixels. The achieved flip angle is indicated by the nearby greyscaling. The quadratic error (or root mean square error) relative to the target magnetization (i.e. the desired "L" pattern) is indicated in the flip angle ($\alpha_{rms}$) via the image.

Thereby shown in the upper line are the achieved target magnetizations without the method according to the invention, i.e. without any correction with regard to possible trajectory errors, wherein in the first, left image a gradient delay time $d_1$ of −10 μs is assumed in each spatial direction, and additional eddy current errors have been simulated; in the middle image an ideal trajectory is assumed; and in the last, right image a gradient delay time $d_2$ of +10 μs in each spatial direction and an eddy current error are assumed. These images unambiguously show that (simulated) gradient errors have a significant effect on the achieved target magnetization.

Shown in the line below this are the achieved target magnetizations given respective identical starting conditions as in the upper image line, but given application of a method according to the invention. Here it is shown that the achieved target magnetization is easily slightly disrupted by the consideration according to the invention only in the (improbable) event that absolutely no gradient errors occur.

However, insofar as an error actually occurs due to eddy currents or, respectively, due to a gradient delay of −10 μs to +10 μs (left and right images in the lower line), the desired target magnetization is achieved significantly better than without the method according to the invention. In particular, the simulations show that it is not absolutely necessary to determine concrete gradient errors due to previously implemented measurements of the gradient trajectory, and then to use these in the additional measurements. In these simulations, the trajectory error model that was defined according to the above equations (4) through (13) has been used under consideration of "worst case" delay times of +/−10 μs in each spatial direction, as well as under consideration of eddy currents.

As described above, the method is applicable for arbitrary k-space trajectories, and also for an arbitrary number of transmission channels. The method likewise shows that it is sufficient to consider only the worst case scenarios, and that the numerical complexity can thereby be reduced.

The method can also be used advantageously if the traversal through k-space simultaneously with the RF pulses (i.e. the k-space trajectories themselves) is also optimized, which would not be possible without further measures given methods that are based on a pre-measurement of the actually achieved k-space trajectory. Therefore, the method according to the invention can be used not only to achieve ideal RF pulses for predetermined k-space trajectories, but also in methods in which optimized k-space trajectories and radio-frequency pulses that have simultaneously been optimized for these are determined.

Although modifications and changes may be suggested by those skilled in the art, it is the intention of the inventors to embody within the patent warranted hereon all changes and modifications as reasonably and properly come within the scope of their contribution to the art.

We claim as our invention:

1. A computerized method to determine a magnetic resonance system control sequence for operating a magnetic resonance apparatus in an acquisition procedure to acquire magnetic resonance data from a subject situated in the magnetic resonance apparatus, said method comprising:
    providing a computer with a target magnetization of nuclear spins in the subject, to be produced a radio-frequency pulse train of said magnetic resonance system control sequence;
    in said computer, determining, or receiving a designation of, a k-space trajectory for entering raw data from the subject into k-space in said acquisition procedure, the entry of said raw data into k-space during said acquisition procedure being subject to deviation from said k-space trajectory due to an error source that occurs in operation of said magnetic resonance apparatus in said acquisition procedure;
    in said computer, automatically optimizing said radio-frequency pulse train for said k-space trajectory by executing an RF pulse optimization algorithm in said computer using a target function comprising a combination of a plurality of different trajectory curve functions, with at least one of said trajectory curve functions being based on a trajectory error model that models the error produced by said at least one error source; and
    making said magnetic resonance system control sequence with the optimized radio-frequency pulse train therein, available in electronic form at an output of said computer, in a format configured to operate said magnetic resonance apparatus.

2. A method as claimed in claim 1 comprising, employing as said target function in said computer, a target function wherein said different trajectory curve functions are based on different trajectory error models.

3. A method as claimed in claim 2 comprising generating said different trajectory error models from a same trajectory error model type, but using different error parameters.

4. A method as claimed in claim 2 comprising generating said different trajectory error models as different trajectory error model types.

5. A method as claimed in claim 1 comprising, in said computer, entering said different trajectory models into said target function with predetermined respective weightings.

6. A method as claimed in claim 1 comprising generating said trajectory error models independently of said raw magnetic resonance data acquired in said acquisition procedure.

7. A method as claimed in claim 1 comprising generating said error model to model an error produced by at least one error source selected from the group consisting of amplitude scaling errors, eddy current errors, basic magnetic field errors, gradient mixed term effects, and coupling effects among radio-frequency antennas.

8. A method as claimed in claim 1 comprising using and optimizing, as said radio-frequency pulse train, a multi-channel pulse train comprising multiple, individual radio-frequency pulse trains emitted in parallel in said acquisition procedure by said magnetic resonance apparatus, via multiple, different, independent radio-frequency transmission channels of said magnetic resonance apparatus.

9. A method as claimed in claim 1 comprising employing, as said target function, a target function formulated as an A-matrix that comprised multiple, different sub-matrices, the respective sub-matrices that are respectively based on said different trajectory curve functions.

10. A method as claimed in claim 9 wherein one of said sub-matrices is based on an ideal trajectory curve function.

11. A computerized method to operate a magnetic resonance apparatus in an acquisition procedure to acquire magnetic resonance data from a subject situated in the magnetic resonance apparatus according to a magnetic resonance system control sequence, said method comprising:
  providing a computer with a target magnetization of nuclear spins in the subject, to be produced a radio-frequency pulse train of a magnetic resonance system control sequence;
  in said computer, determining, or receiving a designation of, a k-space trajectory for entering raw data from the subject into k-space in said acquisition procedure, the entry of said raw data into k-space during said acquisition procedure being subject to deviation from said k-space trajectory due to an error source that occurs in operation of said magnetic resonance apparatus in said acquisition procedure;
  in said computer, automatically optimizing said radio-frequency pulse train for said k-space trajectory by executing an RF pulse optimization algorithm in said computer using a target function comprising a combination of a plurality of different trajectory curve functions, with at least one of said trajectory curve functions being based on a trajectory error model that models the error produced by said at least one error source; and
  making said magnetic resonance system control sequence with the optimized radio-frequency pulse train therein, available in electronic form at an output of said computer, and operating said magnetic resonance apparatus according to said magnetic resonance system control sequence with the optimized radio-frequency pulse train therein.

12. A control sequence determination device to determine a magnetic resonance system control sequence for operating a magnetic resonance apparatus in an acquisition procedure to acquire magnetic resonance data from a subject situated in the magnetic resonance apparatus, said device comprising:
  a computer having an input, provided with a target magnetization of nuclear spins in the subject, to be produced a radio-frequency pulse train of said magnetic resonance system control sequence;
  said computer being configured to determine, or to receive via said input a designation of, a k-space trajectory for entering raw data from the subject into k-space in said acquisition procedure, the entry of said raw data into k-space during said acquisition procedure being subject to deviation from said k-space trajectory due to an error source that occurs in operation of said magnetic resonance apparatus in said acquisition procedure;
  said computer being configured to automatically optimize said radio-frequency pulse train for said k-space trajectory by executing an RF pulse optimization algorithm in said computer using a target function comprising a combination of a plurality of different trajectory curve functions, with at least one of said trajectory curve functions being based on a trajectory error model that models the error produced by said at least one error source; and
  said computer being configured to make said magnetic resonance system control sequence with the optimized radio-frequency pulse train therein, available in electronic form at an output of said computer, in a format configured to operate said magnetic resonance apparatus.

13. A magnetic resonance apparatus comprising:
  a magnetic resonance data acquisition unit operable with a magnetic resonance system control sequence in an acquisition procedure to acquire magnetic resonance data from a subject situated in the magnetic resonance data acquisition unit;
  a computer provided with a target magnetization of nuclear spins in the subject, to be produced a radio-frequency pulse train of said magnetic resonance system control sequence;
  said computer being configured to determine, or to receive a designation of, a k-space trajectory for entering raw data from the subject into k-space in said acquisition procedure, the entry of said raw data into k-space during said acquisition procedure being subject to deviation from said k-space trajectory due to an error source that occurs in operation of said magnetic resonance apparatus in said acquisition procedure;
  said computer being configured to automatically optimize said radio-frequency pulse train for said k-space trajectory by executing an RF pulse optimization algorithm in said computer using a target function comprising a combination of a plurality of different trajectory curve functions, with at least one of said trajectory curve functions being based on a trajectory error model that models the error produced by said at least one error source; and
  said computer being configured to make said magnetic resonance system control sequence with the optimized radio-frequency pulse train therein, available in electronic form at an output of said computer, and to operate said magnetic resonance data acquisition unit according to said magnetic resonance system control sequence with the optimized radio-frequency pulse train therein.

14. A non-transitory, computer-readable data storage medium encoded with programming instructions to determine a magnetic resonance system control sequence for operating a magnetic resonance apparatus in an acquisition procedure to acquire magnetic resonance data from a subject situated in the magnetic resonance apparatus, said storage medium being loaded into a computer and said programming instructions causing said computer to:

receive a target magnetization of nuclear spins in the subject, to be produced a radio-frequency pulse train of said magnetic resonance system control sequence;

determine, or receive a designation of, a k-space trajectory for entering raw data from the subject into k-space in said acquisition procedure, the entry of said raw data into k-space during said acquisition procedure being subject to deviation from said k-space trajectory due to an error source that occurs in operation of said magnetic resonance apparatus in said acquisition procedure;

optimize said radio-frequency pulse train for said k-space trajectory by executing an RF pulse optimization algorithm in said computer using a target function comprising a combination of a plurality of different trajectory curve functions, with at least one of said trajectory curve functions being based on a trajectory error model that models the error produced by said at least one error source; and make said magnetic resonance system control sequence with the optimized radio-frequency pulse train therein, available in electronic form at an output of said computer, in a format configured to operate said magnetic resonance apparatus.

* * * * *